United States Patent
Zakel et al.

(10) Patent No.: US 7,121,449 B2
(45) Date of Patent: Oct. 17, 2006

(54) METHOD AND DEVICE FOR APPLYING MATERIAL TO A WORKPIECE

(75) Inventors: Elke Zakel, Falkensee (DE); Paul Kasulke, Berlin (DE); Oliver Uebel, Berlin (DE); Lars Titerle, Berlin (DE)

(73) Assignee: Pac Tec - Packaging Technologies GmbH, Berlin (DE)

( * ) Notice: Subject to any disclaimer, the term of this patent is extended or adjusted under 35 U.S.C. 154(b) by 245 days.

(21) Appl. No.: 10/398,785

(22) PCT Filed: Oct. 2, 2001

(86) PCT No.: PCT/EP01/11419

§ 371 (c)(1),
(2), (4) Date: Jun. 20, 2003

(87) PCT Pub. No.: WO02/28588

PCT Pub. Date: Apr. 11, 2002

(65) Prior Publication Data

US 2005/0031776 A1  Feb. 10, 2005

(30) Foreign Application Priority Data

Oct. 6, 2000 (DE) ................... 100 49 585

(51) Int. Cl.
| B23K 13/08 | (2006.01) |
| B23K 5/00 | (2006.01) |
| B23K 20/00 | (2006.01) |
| B05D 5/12 | (2006.01) |
| B05D 7/00 | (2006.01) |

(52) U.S. Cl. ............. 228/102; 228/8; 228/41; 228/245; 228/246; 427/8; 427/98.4; 427/180; 427/256

(58) Field of Classification Search ............ 228/8, 228/41, 102, 245, 246; 427/8, 256, 180, 427/98.4; 118/712, 300, 400
See application file for complete search history.

(56) References Cited

U.S. PATENT DOCUMENTS

| 4,661,368 | A | * | 4/1987 | Rohde et al. ............... 427/8 |
| 5,148,963 | A | * | 9/1992 | Hicks ..................... 228/102 |
| 6,093,251 | A | * | 7/2000 | Carr et al. ................ 118/712 |
| 6,152,348 | A | * | 11/2000 | Finn et al. ................ 228/41 |
| 6,336,581 | B1 | * | 1/2002 | Tuchiya et al. ............ 228/33 |
| 6,634,545 | B1 | * | 10/2003 | Razon et al. ............. 228/246 |

FOREIGN PATENT DOCUMENTS

| DE | 195 41 996 A1 | 5/1997 |
| WO | WO 97/17191 A2 | 5/1997 |

* cited by examiner

*Primary Examiner*—Brian K. Talbot
(74) *Attorney, Agent, or Firm*—Dougherty Clements

(57) ABSTRACT

In order to apply solder material (20) to a workpiece (1), compressed gas is guided through a bore hole (5) of a capillary (3). A pressure sensor (13) situated in the bore hole (5) measures the dynamic pressure of the compressed gas. As soon as the tip (12) of the capillary approaches the workpiece (1), the dynamic pressure increases and is used as a measure for the distance between the tip (12) of the capillary (3) and the workpiece (1), enabling the feed motion of the capillary to be controlled.

17 Claims, 2 Drawing Sheets

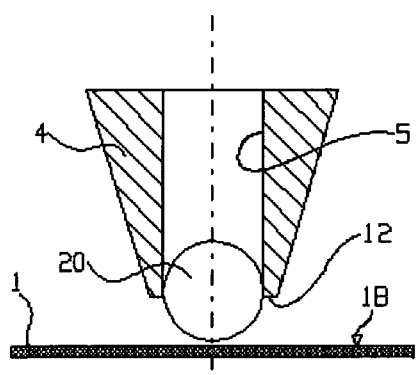
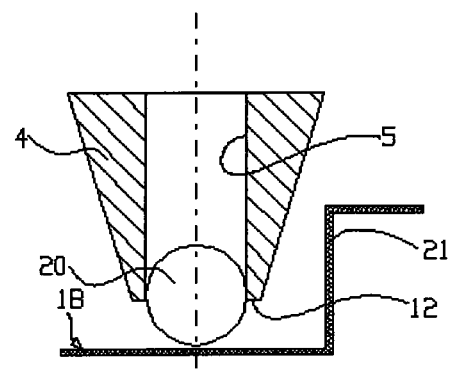
Fig. 2a          Fig. 2b
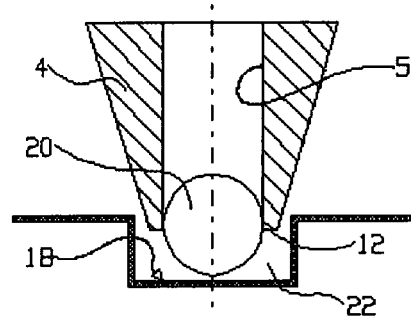
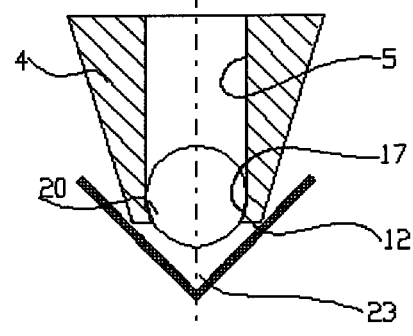
Fig. 2c          Fig. 2d
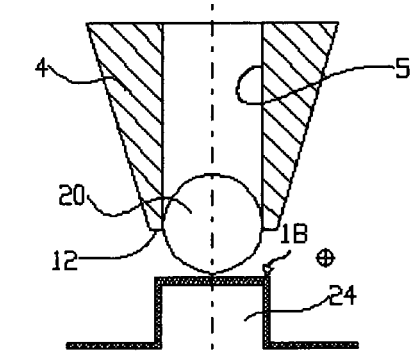
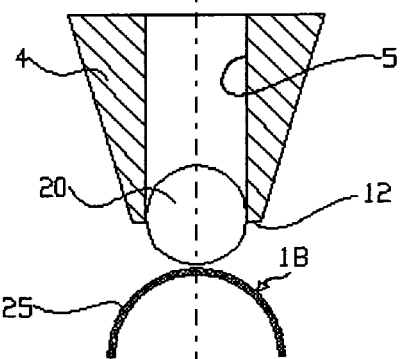
Fig. 2e          Fig. 2f

METHOD AND DEVICE FOR APPLYING MATERIAL TO A WORKPIECE

SPECIFICATION

The invention relates to a method and a device for applying solder material to a workpiece.

DE 195 41 996 describes a device for single feed application of solder pellets from a solder pellet reservoir with an applicator and a separate feeder, the separate feeder being designed as a circular conveyor. Through timed motion of the circular conveyor, solder pellets are conveyed from the reservoir to a capillary and by means of compressed air to the end of the capillary which at this point in time is close to a soldering point on the workpiece. The solder pellet is melted by laser energy and flows onto the soldering point. A pressure sensor is provided in the capillary which measures a static pressure which, under compressed gas loading, builds up only when a solder pellet is located on the end of the capillary and lies directly over a soldering point. Only then is the laser triggered. Before placement, a vertical feed motion may take place there as needed.

Precise positioning of the capillary and precisely timed feed of solder pellets to the end of the capillary are essential conditions for effective and rapid operation of the device. With the known device, fixed programming determines the coordinates of the points for placement of the solder pellets. The result of inaccuracies in clamping of the workpiece on which the solder pellets are to be applied or even deviations in dimensions is that it can happen that the capillary is not always precisely positioned. If the capillary is too far from the workpiece, the solder pellet can cool too much on "dropping down" so that there can be no satisfactory soldered joint. If spacing is too little, there can be a collision between between the workpiece and the capillary and one or both will be damaged.

Material pieces within the meaning of the invention are pieces of any material in solid or liquid form. Materials can include any solderable materials such as gold, copper, tin, glass or plastic, particularly micro-particulates in the form of solder pellets, glass globules or plastic pellets. They can also include pieces of ceramics and structural components such as miniature circuits, surface mounted device components or the like. Generally speaking, any material can be applied with the invention.

The object of the invention is to develop a method and device such that a very high degree of application accuracy is achieved.

This object is achieved by the features indicated in patent claims 1, 2 and 10. Advantageous developments of the invention will be seen in the sub-claims.

The basic principle of the invention consists in that the distance between the capillary and the workpiece on which the piece of material is to be placed during the vertical feed motion (the z-direction) is to be measured in that the compressed gas flows through the capillary and the the dynamic pressure of this gas at the end of the capillary is measured. That is, as soon as the tip of the capillary has come sufficiently close to the workpiece, which in practice is in the order of 400 micrometers, the dynamic pressure rises appreciably and can be used as a measure of the vertical distance.

This is possible not only when the surface of the workpiece is flat but also when it has any three-dimensional shape, for example, a cavity, e.g., a v-shaped or rectangular groove, a step, an edge or an elevation.

As soon as the capillary is properly positioned through this determination of position in the vertical direction, a piece of material is brought to the end of the capillary by the feeder which is known in principle. The feeder then then seals off the capillary to the extent possible which causes the dynamic pressure to rise further and signals the presence of the piece of material. In a variant of the invention, withdrawal of the capillary then releases the piece of material. In another variant of the invention related to solderable pieces of material, a laser for melting the piece of material is then activated as a function of this signal.

In one development of the invention related to solderable material, the tip of the capillary can be tapered to the point where its opening width is smaller than the diameter of the piece of material. The piece of material is thereby still kept at the end of the capillary even when the distance between the tip of the capillary and is greater than the radius of the piece of material.

A source of heat for melting the solder pellet is then activated as a function of the signal mentioned above. This source of heat can, for example, be a laser, an infrared beam, hot air, heating of the tip of the capillary or any other supply of energy leading to remelting of the piece of material.

The invented method includes the following steps:
Positioning of the capillary whereby a compressed gas is conducted through the capillary at least on motion in the vertical direction and the dynamic pressure in the capillary is measured;
Ending of the vertical feed when the dynamic pressure has reached a preset value;
Feed of a piece of material to the tip of the capillary;
Further measurement of the dynamic pressure and
Either a triggering of the laser for melting the pieced of material when the dynamic pressure has reached a second greater value or
Release of the piece of material by withdrawal of the capillary.

The invention is explained in more detail below using an example embodiment with reference to the drawing wherein:

FIG. 2a to 2f are enlarged views of the tip of the capillary with different surfaces of the workpiece.

Figure 1:
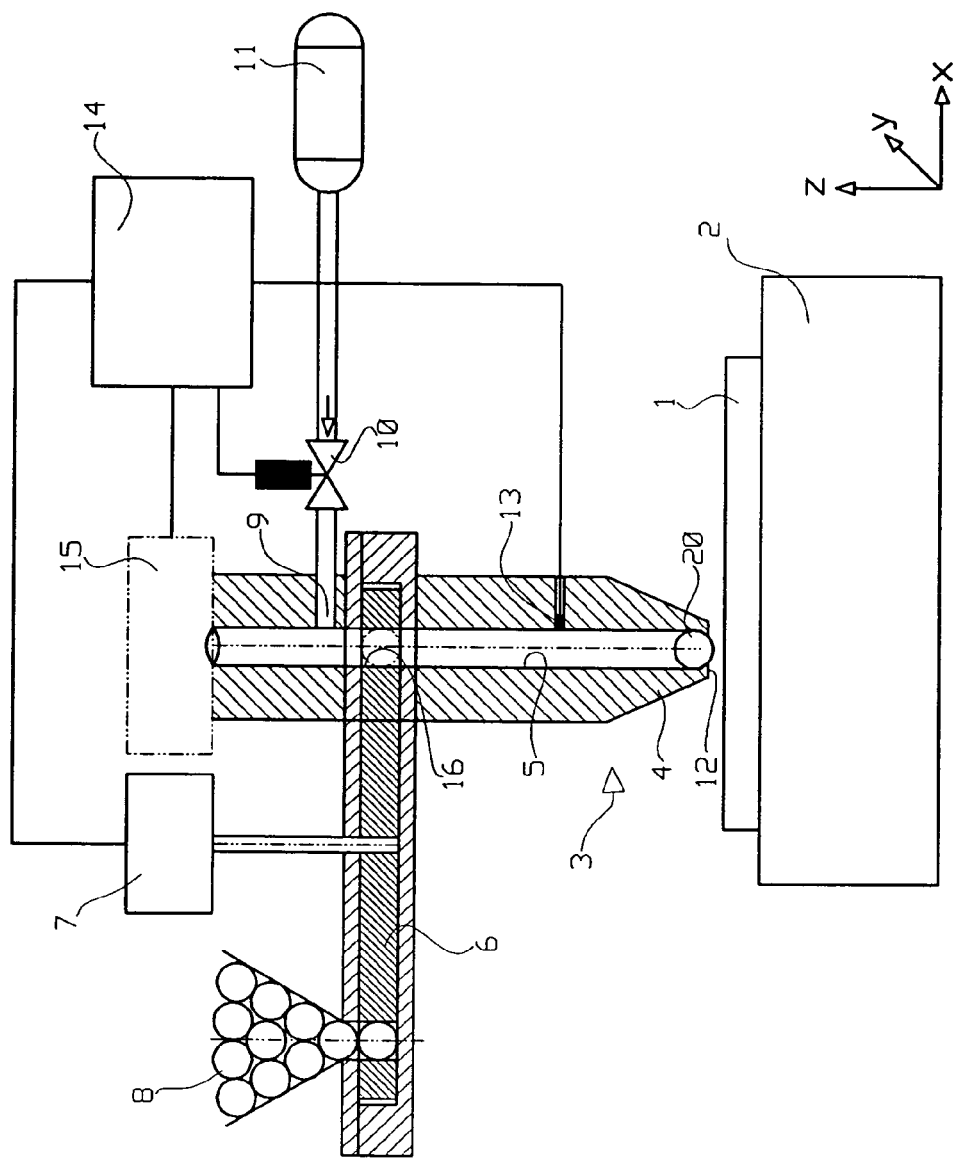
FIG. 1 is a schematic diagram of a device according to the invention.

Although the example embodiments in FIGS. 1 and 2 relate to the application of the solder pellets, it is expressly pointed out that any pieces of material as described in the beginning can be applied.

Reference is made first to FIG. 1. A workpiece 1 on which solder pellets are to be soldered is mounted on a cross-table 2 which, relative to an application device 3, can be moved along at least three cartesian coordinates, x, y and z. of course, it is also possible to move the application device 3 relative to a stationary table 2 or to divide the motion, that is, the table can be moved in the x and y-directions while the application device can be moved in the z-direction.

The application device 3 has a capillary 4 with a bore hole 5, the diameter of which corresponds basically to the diameter of a solder pellet 20. A conveyor 6 in the form of a rotating disc driven by a motor 7 has a plurality of holes for receiving solder pellets. Located in a reservoir is a supply of solder pellets which are transferred separately by the conveyor 6 to the bore hole 5.

Opening into the bore hole 5 is a transverse bore hole 9 through which a compressed gas is fed to the bore hole. A controllable valve 10 can be used to allow the compressed gas to flow out of a supply container 11 and/or a pressure generator and through the bore hole and convey a solder pellet by means of the conveyor 6 to the tip 12 of the capillary 4. Arranged in the bore hole 5 is a pressure sensor 13 which measures the dynamic pressure of the compressed gas in the bore hole 5. A signal coming from the pressure sensor is fed to a controller 14 which controls the motor 7, the valve 10 and a laser device 15 as well as the feed motions between the capillary 3 and the cross-table 2.

The device operates as follows:

It is assumed that a solder pellet was just set in place and the bore hole 5 allows free passage. The capillary 4 is now run to the next position where a further solder pellet is to be placed. A motion is also carried out in the vertical direction, that is, in the z-direction. As soon as the tip 12 of the capillary approaches the next soldering point and a feed motion in the z-direction is needed, the controller 14 switches the valve 10 so that compressed gas such as a protective gas flows through the bore hole 5 as well as through the opening 16 free at this time in the conveyor 6. The pressure sensor 13 then measures the dynamic pressure and reports it to the controller 14 which causes the feed motion to continue until the dynamic pressure has reached a preset value. The feed motion in the z-direction then comes to an end and the controller 14 then actuates the motor 7 so that the conveyor 6 moves a new solder pellet from the reservoir 8 to the bore hole 5. The valve 10 can be open or closed during this feed motion. As soon as a new solder pellet has reached the bore hole 5, the pellet is moved by the compressed gas toward the tip 12 of the capillary. As soon as the pellet has reached the tip 12, the dynamic pressure at the pressure sensor 13 will continue to rise. As soon as it has reached a preset value, the controller 14 will activate the laser device 15 and a laser beam conducted through the bore hole 5 will melt the solder pellet 6. A new work cycle can then begin. If the piece of material is not to be melted, the laser device will naturally not be needed and the piece of material will be released by withdrawal of the capillary.

FIG. 2 shows the capillary 4 with bore hole 5 and a piece of material in the form of a solder pellet 20 to be placed on the workpiece 1 or a substrate. In FIG. 2a, the surface the surface 18 of the workpiece 1 is completely flat. In FIG. 2b, the application point is located close to a step 21. In FIG. 2c, the application point is a cavity which here is in the form of a rectangular groove 22. In FIG. 2d, the cavity is a v-shaped slot 23. A slot of this kind can be created, for example, where two printed circuit boards are vertical with respect to each other.

In FIG. 2e, the application point is on an elevation 24 which in turn has a flat surface 18, while in FIG. 2f, the application point lies on an elevation 25 which is rounded.

It will be clear to the specialist in the field that the increasing dynamic pressure on the approach of the capillary 4 to the surface of the workpiece 1 will depend on the shape and structure of the surface. For example, the dynamic pressure in the cases of FIGS. 2c and 2d will rise faster and achieve higher values than, for example, in the cases of FIGS. 2a, 2e and 2f. However, it has been found in these cases as well that a significant increase in dynamic pressure occurs on the approach of the capillary to the surface which will allow derivation of a precise signal for the distance with the feed motion. All that is required is an adjustment of the response threshold value depending on the case of application.

In the example embodiments of FIG. 2a to 2f, the bore hole 5 has a uniform diameter in each case. The tip is then positioned so close over the object 1 so that its distance corresponds to the radius of the solder pellet. The solder pellet is then held between the bore hole 5 and the surface of the object 1 and thus also closes off the bore hole 5 causing the dynamic pressure to rise and thus giving a significant signal for the presence of a solder pellet at the tip 12.

For many application cases, it can also be necessary to provide a narrowing (not shown) at the tip 12 of the bore hole 5 for holding the piece of material such that it will not be able to escape the bore hole until melting takes place.

Finally, it should be pointed out that the invention can also be used for applying pieces of material or removing them from the surface of an object. For repairing defective soldered joints, a laser can be used here which is activated when the dynamic pressure indicates that a preset distance from the surface of the workpiece has been reached. The soldered joint can then be melted by the laser and the liquid solder can be suctioned through the capillary 5. The concept of application is thus also to be understood in this extended sense of application and/or removal.

It would also be possible in general to provide the bore hole 5 with a uniformly continuous diameter. The tip 12 will then be positioned so close over the object 1 that its distance corresponds about to the radius of the solder pellet. The solder pellet will then be held between the bore hole 5 and the surface of the object 1, thus closing off the bore hole 5 as well which causes a rise in the dynamic pressure.

In many cases, a solder pellet must also be placed in a v-shaped slot, e.g., at places where two printed circuit boards are vertical with respect to each other, as shown in the case with the v-shaped slot 18 in FIG. 2. Here as well, the dynamic pressure is significant for the distance with the feed motion in the z-direction and also significant for the presence of a solder pellet at the tip 12. It is advantageous for this kind of application for the tip of the capillary to have a narrowing 17.

The invention claimed is:

1. Method for application of pieces of meltable material located in a bore hole of a capillary to a workpiece, comprising the following steps:
    introduction of a compressed gas into the bore hole while measuring the dynamic pressure in the bore hole at least during a feed motion of the capillary in the vertical direction toward the workpiece,
    using the dynamic pressure measurement to determine the height of the capillary relative to the workpiece,
    ceasing the feed motion when the dynamic pressure has reached a first preset value,
    conveying of a piece of material through the bore hole to the tip of the capillary by further introduction of the compressed gas, and
    releasing of the piece of material by withdrawal of the capillary.

2. Method for application of pieces of meltable material located in a bore hole of a capillary to a workpiece comprising the following steps:
    introduction of a compressed gas into a bore hole while measuring the dynamic pressure in the bore hole at least during a feed motion of the capillary in the vertical direction toward the workpiece,
    ceasing the feed motion when the dynamic pressure has reached a first preset value,
    conveying of a piece of material through the bore hole to the tip of the capillary by further introduction of the compressed gas, and
    measuring of the dynamic pressure in the bore hole and melting the piece of material when the dynamic pressure has reached a second preset value.

3. Method as described in claim 1, characterized in that the pieces of meltable material are selected from the group comprising: solder material, gold, copper, tin, glass, plastic, or ceramic.

4. Method as described in claim 2, characterized in that the second preset value is greater than the first preset value.

5. Method as described in claim 1, characterized in that the workpiece at the application point has a three-dimensional structure.

6. Method as described in claim 5, characterized in that the workpiece at the application point has a cavity (22, 23).

7. Method as described in claim 6, characterized in that the cavity has a v-shaped slot (23).

8. Method as described in claim 6, characterized in that the cavity is a groove (22).

9. Method as described in claim 1, characterized in that the workpiece at the application point has an elevation (24, 25).

10. Method as described in claim 1, characterized in that the workpiece at the application point is flat.

11. Method as described in claim 1, characterized in that the pieces of meltable material are selected from the group comprising: solder material, gold, copper, tin, glass, plastic, or ceramic.

12. Method as described in claim 2, characterized in that the workpiece at the application point has a three-dimensional structure.

13. Method as described in claim 12, characterized in that the workpiece at the application point has a cavity (22, 23).

14. Method as described in claim 13, characterized in that the cavity has a v-shaped slot (23).

15. Method as described in claim 13, characterized in that the cavity is a groove (22).

16. Method as described in claim 2, characterized in that the workpiece at the application point has an elevation (24, 25).

17. Method as described in claim 2, characterized in that the workpiece at the application point is flat.

* * * * *